United States Patent
Tung et al.

(10) Patent No.: US 7,926,554 B2
(45) Date of Patent: Apr. 19, 2011

(54) HEAT DISSIPATION SYSTEM

(75) Inventors: Tsai-Shih Tung, Tu-Cheng (TW); Chun-Yi Chang, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1273 days.

(21) Appl. No.: 11/437,940

(22) Filed: May 19, 2006

(65) Prior Publication Data

US 2007/0034354 A1     Feb. 15, 2007

(30) Foreign Application Priority Data

Aug. 12, 2005   (CN) .......................... 2005 1 0036584

(51) Int. Cl.
*F28D 15/00* (2006.01)
(52) U.S. Cl. ............. 165/104.19; 165/80.4; 165/104.15; 165/104.23; 165/104.33
(58) Field of Classification Search .................. 165/80.2, 165/80.4, 80.5, 104.15, 104.19, 104.23, 104.33
See application file for complete search history.

(56) References Cited

U.S. PATENT DOCUMENTS

| | | | |
|---|---|---|---|
| 6,400,012 B1 | 6/2002 | Miller et al. | |
| 7,455,101 B2 * | 11/2008 | Hsu | 165/104.33 |
| 2005/0116336 A1 * | 6/2005 | Chopra et al. | 257/720 |
| 2006/0110262 A1 * | 5/2006 | Hsu | 417/208 |

FOREIGN PATENT DOCUMENTS

CN   1500977 A   6/2004

OTHER PUBLICATIONS

Xie Huaqing, Wu Qingren, Wang Jinchang, Xi Tonggeng, Liu Yan; Thermal Conductivity of Suspension Containing Nanosized Al2O3 Particles; Journal of the Chinese Ceramic Society; Jun. 2002, vol. 30, No. 3, pp. 272-276; Shanghai Institute of Ceramics, Chinese Academy of Sciences, Shanghai; Department of Materials, South China.
Shi Rongying, Zhuang Yunlong; The Citric Acidized Surfactant; Detergent & Cosmetics; Aug. 1998, No. 4, pp. 15-16.
Xuan Yimin, Li Qiang. Heat Transfer Enhancement of Nanofluids, Journal of Engineering thermophysics, Jul. 2000 vol. 21, No. 4 pp. 446-470, Institute of Engineering Thermophysics, Chinese Academy of Sciences, Beijing.

* cited by examiner

*Primary Examiner* — Ljiljana (Lil) V Ciric
(74) *Attorney, Agent, or Firm* — Jeffrey T. Knapp

(57) ABSTRACT

A liquid-cooled heat dissipation system includes a heat absorber; a heat dissipating member; two connecting pipes connecting the heat absorber and the heat dissipating member; and a working fluid filled in the heat absorber, the heat dissipating member, and the connecting pipes. The working fluid is capable of circulating in the circuit. The working fluid includes a base fluid, a plurality of nanoparticles and a protective agent dispersed in the base fluid. A percentage by weight of the nanoparticles in the working fluid is in the range from 0.1% to 3%.

9 Claims, 1 Drawing Sheet

HEAT DISSIPATION SYSTEM

TECHNICAL FIELD

The present invention relates to a heat dissipation system, and more particularly to a liquid-cooled heat dissipation system.

BACKGROUND

Electronic components such as semiconductor chips are becoming progressively smaller, while at the same time heat dissipation requirements thereof are increasing. In many contemporary applications, an air-cooled heat dissipation system is one of the most popular systems in use for transmitting heat away from such components.

A typical air-cooled heat dissipation system comprises a heat sink to absorb heat from an electronic component and a fan for generating forced airflow to flow through the heat sink to take heat away therefrom. The air-cooled heat dissipation system has advantages such as simple structure, low cost, and good compatibility with electronic components. However, the heat dissipation capacity of an air-cooled heat dissipation system is limited by the low thermal conductivity of air.

In order to satisfy the increasing heat dissipation requirements, a typical liquid-cooled heat dissipation system is provided. The liquid-cooled heat dissipation system generally comprises a heat absorber, a heat dissipating member, a working fluid, a pump, and a connecting pipe. Heat of a heat source is absorbed by the heat absorber and then carried away by the working fluid inside the connecting pipe, and finally dissipated to ambient air via the heat dissipating member. The working fluid of the typical liquid-cooled heat dissipation system generally employs a pure liquid. However, the pure liquid generally has a relative low thermal conductivity. Accordingly, the thermal resistances between the pure liquid and the heat absorber, the heat dissipating member, and the connecting pipe are relatively high, which results that the heat transfer efficiency of the working fluid is relatively low. That is to say, the heat dissipation efficiency of the liquid-cooled heat dissipation system is restricted by the thermal conductivity of the working fluid.

What is needed, therefore, is a liquid-cooled heat dissipation system which provides high heat dissipation efficiency.

SUMMARY

In a preferred embodiment, a liquid-cooled heat dissipation system includes a heat absorber; a heat dissipating member; two connecting pipes connecting the heat absorber and the heat dissipating member to form a circuit; and a working fluid filled in the heat absorber, the heat dissipating member, and the connecting pipes and being capable of circulating in the circuit. The working fluid includes a base fluid, a plurality of nanoparticles and a protective agent dispersed in the base fluid. A percentage by weight of the nanoparticles in the working fluid is in the range from 0.1% to 3%.

Other advantages and novel features will become more apparent from the following detailed description when taken in conjunction with the accompanying drawings, in which:

BRIEF DESCRIPTION OF THE DRAWINGS

Many aspects of the present liquid-cooled heat dissipation system can be better understood with reference to the following drawings. The components in the drawings are not necessarily to scale, the emphasis instead being placed upon clearly illustrating the principles of the present liquid-cooled heat dissipation system. Moreover, in the drawings, like reference numerals designate corresponding parts throughout the several views.

Figure 1:
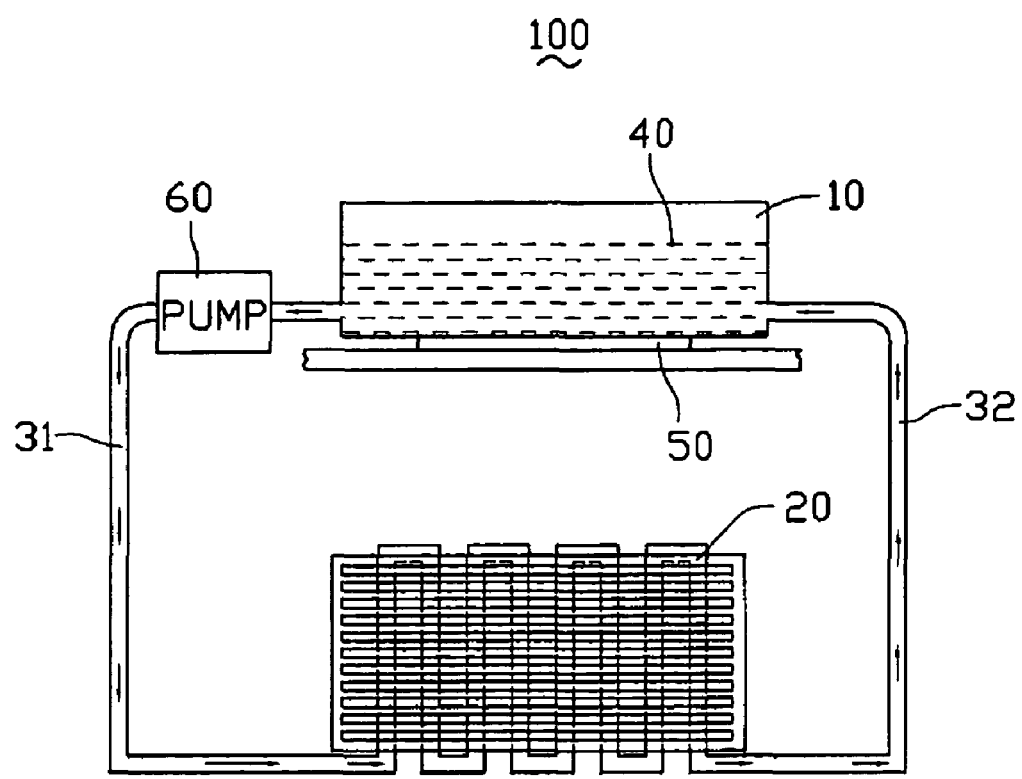
FIG. 1 is a schematic view of a liquid-cooled heat dissipation system in accordance with a preferred embodiment.

The exemplifications set out herein illustrate at least one preferred embodiment of the invention, in one form, and such exemplifications are not to be construed as limiting the scope of the invention in any manner.

DETAILED DESCRIPTION OF PREFERRED EMBODIMENTS

Embodiments of the present liquid-cooled heat dissipation system will now be described in detail below and with reference to the drawings.

Referring to FIG. 1, a liquid-cooled heat dissipation system 100 according to a preferred embodiment is provided. The liquid-cooled heat dissipation system 100 comprises a heat absorber 10; a heat dissipating member 20; two connecting pipes 31, 32 connecting the heat absorber 10 and the heat dissipating member 20 to form a circuit; and a working fluid 40 filled in the heat absorber 10, the heat dissipating member 20, and the connecting pipes 31, 32 and being capable of circulating in the circuit. The working fluid 40 includes a base fluid, a plurality of nanoparticles and a protective agent dispersed in the base fluid. A percentage by weight of the nanoparticles in the working fluid is in the range from 0.1% to 3%. The nanoparticles have an average grain size in the range from 1 nanometer to 500 nanometers. The protective agent can prevent congregations of the nanoparticles. The liquid-cooled heat dissipation system 100 further comprises a pump 60 connected in the circuit.

The heat absorber 10 is attached to a heat source 50 and configured for absorbing heat from the heat source 50. The heat absorber 10 comprises a closed chamber containing the working fluid 40 therein. The heat dissipating member 20 can employ a radiator or an air heat exchanger, etc. The pump 60 is configured for driving the working fluid 40 to circulate in the circuit. In operation, the heat absorber 10 absorbs heat from the heat source 50, the working fluid 40 is driven by the pump 60 and transmits heat from the heat absorber 10 to the heat dissipating member 20 by flowing from the heat absorber 10 to the heat dissipating member 20 via the connecting pipe 31, and then flowing back from the heat dissipating member 20 to the heat absorber 10 via the connecting pipe 32. Thus, heat dissipation of the heat source 50 can be performed by circulating the working fluid 40 in the liquid-cooled heat dissipation system 100.

The base fluid can be selected from the group comprising of water, alcohol, ketone, and any suitable mixture thereof The alcohol can be selected from the group comprising of methanol, ethanol, propanol, n-butanol, n-pentanol, n-hexanol, n-heptanol, n-octanol, glycol, and any suitable mixture thereof The ketone is acetone. The nanoparticles can be made from material selected from the group comprising of gold, silver, copper, aluminum, copper oxide, aluminum oxide, boron nitride, aluminum nitride, zinc oxide, and any suitable mixture thereof The protective agent can be selected from the group comprising of citric acid, citrate, tannin, polyvinyl alcohol, polyvinyl pyrrolidone, quaternary ammonium salt, and any suitable mixture thereof. The citrate can be selected from the group comprising of sodium citrate, potassium citrate, and a mixture thereof. In the preferred embodiment, the base fluid employs water, the nanoparticles are made from copper, and the protective agent employs polyvinyl alcohol.

The nanoparticles have an average grain size in the range from 1 nanometer to 100 nanometers. A percentage by weight of the protective agent in the working fluid is about 0.05 to 2 times of that of the nanoparticles.

The working fluid 40 can be manufactured by a chemical reduction method. The method comprises the steps of: providing a certain stoichiometry of metal ions solution, reductant, and suitable protective agent; reacting the metal ions solution, the reductant, and the protective agent by mixing them, diluting the solution after the reaction thereby obtaining the working fluid 40. The metal ions solution can be selected from the group comprising of hydrogen tetrachloroaurate(III) hydrate, silver nitrate, silver perchlorate, copper sulfate, silver chloride, cupric nitrate, and any suitable mixture thereof. The reductant can be selected from the group comprising of sodium borohydride, sodium hypophosphite, hydrazine, stannous chloride, sodium citrate, tannin, polyvinyl alcohol, polyvinyl pyrrolidone, quaternary ammonium salt, and any suitable mixture thereof. The diluting step can be performed with water, alcohol, ketone, and any suitable mixture thereof. The alcohol can be selected from the group comprising of methanol, ethanol, propanol, n-butanol, n-pentanol, n-hexanol, n-heptanol, n-octanol, glycol, and any suitable mixture thereof. The ketone is acetone.

As stated above, in the present liquid-cooled heat dissipation system, the working fluid comprises nanoparticles and protective agent dispersed therein, the nanoparticles have a very small average grain size, and congregations of the nanoparticles can be avoid by the protective agent. Therefore, the working fluid in the liquid-cooled heat dissipation system can circulate without blocking. Furthermore, the nanoparticles dispersed in the working fluid have high thermal conductivities, the internal thermal resistance of the liquid-cooled heat dissipation system thereby can be reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid-cooled heat dissipation system comprising:
   a heat absorber;
   a heat dissipating member;
   two connecting pipes connecting the heat absorber and the heat dissipating member to form a circuit; and
   a working fluid filled in the heat absorber, the heat dissipating member, and the connecting pipes and being capable of circulating in the circuit;
   the working fluid comprising a base fluid, and a plurality of nanoparticles and a protective agent dispersed in the base fluid, a percentage by weight of the nanoparticles in the working fluid being in a range from 0.1% to 3%.

2. The heat dissipation system in accordance with claim 1, wherein the heat dissipating member employs one of a radiator and an air heat exchanger.

3. The heat dissipation system in accordance with claim 1, wherein the base fluid is ketone.

4. The heat dissipation system in accordance with claim 3, wherein the ketone is acetone.

5. The heat dissipation system in accordance with claim 3, wherein the nanoparticles are made from boron nitride.

6. The heat dissipation system in accordance with claim 5, wherein the nanoparticles have an average grain size in a range from 1 nanometer to 500 nanometers.

7. The heat dissipation system in accordance with claim 5, wherein the protective agent is tannin.

8. The heat dissipation system in accordance with claim 1, wherein a percentage by weight of the protective agent in the working fluid is in a range from 0.05 to 2 times that of the nanoparticles.

9. The heat dissipation system in accordance with claim 1, wherein the working fluid is driven to circulate in the circuit by a pump which is connected in the circuit.

* * * * *